United States Patent
Hoteida et al.

(10) Patent No.: US 11,186,922 B2
(45) Date of Patent: Nov. 30, 2021

(54) APPARATUS FOR PRODUCING GROUP-III NITRIDE SEMICONDUCTOR CRYSTAL INCLUDING NITROGEN SOURCE NOZZLES WITH DIFFERENT SPRAY DIRECTIONS

(71) Applicant: Panasonic Corporation, Osaka (JP)

(72) Inventors: Masayuki Hoteida, Osaka (JP); Shunichi Matsuno, Kyoto (JP); Junichi Takino, Osaka (JP)

(73) Assignee: PANASONIC CORPORATION, Osaka (JP)

( * ) Notice: Subject to any disclaimer, the term of this patent is extended or adjusted under 35 U.S.C. 154(b) by 0 days.

(21) Appl. No.: 16/889,852

(22) Filed: Jun. 2, 2020

(65) Prior Publication Data

US 2020/0385886 A1  Dec. 10, 2020

(30) Foreign Application Priority Data

Jun. 6, 2019 (JP) .............................. JP2019-106289
Mar. 19, 2020 (JP) .............................. JP2020-049704

(51) Int. Cl.
  *C30B 35/00* (2006.01)
  *C30B 25/16* (2006.01)
  (Continued)

(52) U.S. Cl.
  CPC ............ *C30B 25/165* (2013.01); *C30B 25/10* (2013.01); *C30B 25/12* (2013.01); *C30B 29/406* (2013.01); *Y10T 117/1016* (2015.01)

(58) Field of Classification Search
  CPC ......... C30B 25/00; C30B 25/02; C30B 25/10; C30B 25/12; C30B 25/14; C30B 25/16;
  (Continued)

(56) References Cited

U.S. PATENT DOCUMENTS 6,001,175 A   12/1999 Maruyama et al.
8,470,694 B2   6/2013 Tanaka et al.
(Continued)

FOREIGN PATENT DOCUMENTS

| JP | 52-023600 | 2/1977 |
| JP | 8-239295 | 9/1996 |
| JP | 10-158098 | 6/1998 |
| JP | 2008-504443 | 2/2008 |
| JP | 2011-171325 | 9/2011 |
| WO | 2015/053341 | 4/2015 |

*Primary Examiner* — Kenneth A Bratland, Jr.
(74) *Attorney, Agent, or Firm* — Wenderoth, Lind & Ponack L.L.P.

(57) ABSTRACT

An apparatus for producing a Group-III nitride semiconductor crystal includes a raw material reaction chamber, a raw material reactor which is provided in the raw material reaction chamber and configured to generate a Group-III element-containing gas, a board-holding member configured to hold a board in the raw material reaction chamber, a raw material nozzle configured to spray the Group-III element-containing gas toward the board, a nitrogen source nozzle configured to spray a nitrogen element-containing gas toward the board, in which, in a side view seen in a direction perpendicular to a vertical direction, a spray direction of the nitrogen source nozzle intersects with a spray direction of the raw material nozzle before the board, and a mixing part in which the Group-III element-containing gas and the nitrogen element-containing gas are mixed together is formed around the intersection as a center, a heater, and a rotation mechanism.

2 Claims, 6 Drawing Sheets

(51) Int. Cl.
*C30B 29/40* (2006.01)
*C30B 25/12* (2006.01)
*C30B 25/10* (2006.01)

(58) Field of Classification Search
CPC ....... C30B 25/165; C30B 29/00; C30B 29/10; C30B 29/40; C30B 29/403; C30B 29/406; C30B 35/00; C30B 35/002; C23C 16/22; C23C 16/30; C23C 16/301; C23C 16/303; C23C 16/455; C23C 16/45502; C23C 16/45514; C23C 16/45563; C23C 16/45574; C23C 16/45576; C23C 16/45578; Y10T 117/1016
USPC ............ 117/84, 88, 102, 200, 204, 937, 952
See application file for complete search history.

(56) References Cited

U.S. PATENT DOCUMENTS

| | | | |
|---|---|---|---|
| 2008/0132040 A1* | 6/2008 | Wang | C30B 25/02 438/478 |
| 2010/0024727 A1* | 2/2010 | Kim | C23C 16/45565 118/715 |
| 2016/0090665 A1* | 3/2016 | Okayama | C30B 25/10 117/88 |
| 2016/0268129 A1 | 9/2016 | Mori et al. | |

* cited by examiner

FIG. 9

(Table 1)

|  | Comparative example 1 | Example 1 |
|---|---|---|
| Gas mixing degree | 2.34 | 0.29 |

FIG. 10

(Table 2)

|  | Rotation speed (RPM) | |
|---|---|---|
|  | -2300 | 2300 |
| GaO transport efficiency (%) | 6.3 | 8.6 |

APPARATUS FOR PRODUCING GROUP-III NITRIDE SEMICONDUCTOR CRYSTAL INCLUDING NITROGEN SOURCE NOZZLES WITH DIFFERENT SPRAY DIRECTIONS

BACKGROUND

1. Technical Field

The present disclosure relates to an apparatus for producing a Group-III nitride semiconductor crystal. The present disclosure relates particularly to an apparatus for producing a Group-III nitride semiconductor crystal which is a vapor-phase growth apparatus including a nozzle that is disposed opposite to a board-holding member for placing a board to be processed in a reaction furnace and is provided to supply gas toward the board to be processed.

2. Description of the Related Art

Group-III nitride semiconductors such as GaN, AlGaN, and InGaN are used in the fields of optical devices such as light emitting diodes and semiconductor lasers, heterojunction high-speed electronic devices, and the like. As one of methods for producing GaN, which is a Group-III nitride semiconductor, Hydride Vapor Phase Epitaxy (HVPE method) in which a Group-III element metal (for example, Ga metal) and a chloride gas (for example, HCl gas) are reacted with each other to generate a Group-III element metal chloride gas (GaCl gas) and GaN is grown from the Group-III element metal chloride and a nitrogen element-containing gas (for example, $NH_3$ gas) is in practical use (for example, refer to Japanese Patent Unexamined Publication No. S52-23600).

However, in the HVPE method, a large amount of $NH_4Cl$ (ammonium chloride), which is a by-product in crystal growth, is generated and plugs an exhaust pipe of a production apparatus, and thus there is a problem in that crystal growth is hindered. As a method for solving this problem, Oxygen Vapor Phase Epitaxy (OVPE method) in which a Group-III element metal (for example, Ga metal) and an oxidant (for example, $H_2O$ gas) are reacted with each other to generate a Group-III element metal oxide gas ($Ga_2O$ gas) and GaN is grown from a Group-III element metal oxide and a nitrogen element-containing gas (for example, $NH_3$ gas) has been proposed (for example, refer to WO2015/053341).

A feature of the HVPE method or the OVPE method is that a growth rate of 10 μm/h or more or 100 μm/h or more, which is extremely fast compared with a typical growth rate of approximately 1 μm/h in other crystal growth methods such as a metal organic chemical vapor deposition method (MOCVD method) or a molecular beam epitaxy method (MBE method), can be obtained. Therefore, the method is used for the manufacturing of a free-standing GaN board.

FIG. 7 is a schematic cross-sectional view showing a typical cross-sectional structure of an OVPE apparatus which is one of Group-III nitride semiconductor crystal production apparatuses 50 of the related art. This OVPE apparatus includes reaction container 101 configured to carry out the crystal growth of a nitride semiconductor, and, in reaction container 101, raw material container 103 is provided in raw material reaction chamber 102 configured to generate a Group-III element gas such as $Ga_2O$. Raw material container 103 configured to be heated by first heater 104 contains metal raw material 106 including Ga, In, Al, or the like, and raw material container 103 is connected to reactive gas supply pipe 107 configured to supply a reactive gas such as $H_2O$ gas. A Group-III element-containing gas is generated in raw material container 103 by a reaction between the reactive gas supplied from reactive gas supply pipe 107 into raw material container 103 and metal raw material 106. The generated Group-III element-containing gas is introduced into raw material container 103 from Group-III element-containing gas supply pipe 108 connected to raw material container 103 and is transported to seed board 111 placed on board susceptor 112. Seed board 111 is heated by a second heater. In addition, reaction container 101 is provided with nitrogen element-containing gas supply pipes 109 configured to supply a nitrogen element-containing gas such as $NH_3$ gas. The Group-III element-containing gas transported to seed board 111 and the nitrogen element-containing gas react with each other, whereby a Group-III nitride semiconductor crystal grows on seed board 111.

As shown in FIG. 7, generally, Group-III element-containing gas supply pipe 108 and nitrogen element-containing gas supply pipes 110 are configured perpendicular to a main surface of seed board 111. As a drawback of a typical OVPE apparatus in the related art, as shown in FIG. 7, the Group-III element-containing gas and the nitrogen element-containing gas are discharged in parallel with each other, and thus the Group-III element-containing gas and the nitrogen element-containing gas are not easily mixed together. Therefore, it is difficult to control the in-plane uniformity of the film thickness and crystallinity of a Group-III nitride semiconductor crystal.

Published Japanese Translation No. 2008-504443 of the PCT International Publication proposes an apparatus configuration for improving the mixing property of the Group-III element-containing gas and the nitrogen element-containing gas. Published Japanese Translation No. 2008-504443 of the PCT International Publication describes a structure in which a uniforming partition such as a mixing chamber or a mixing plate is provided between a gas supply pipe and a board in order to uniformly mix the Group-III element-containing gas and the nitrogen element-containing gas.

SUMMARY

In order to achieve an object, an apparatus for producing a Group-III nitride semiconductor crystal according to the present disclosure includes a raw material reaction chamber, a raw material reactor which is provided in the raw material reaction chamber and generates a Group-III element-containing gas, a board-holding member configured to hold a board in the raw material reaction chamber, a raw material nozzle configured to spray the Group-III element-containing gas toward the board in the raw material reaction chamber, a nitrogen source nozzle configured to spray a nitrogen element-containing gas toward the board in the raw material reaction chamber, in which, in a side view seen in a direction perpendicular to a vertical direction, a spray direction of the nitrogen source nozzle intersects with a spray direction of the raw material nozzle before the board, and a mixing part in which the Group-III element-containing gas and the nitrogen element-containing gas are mixed together is formed around the intersection as a center, a heater for heating the raw material reaction chamber, the raw material nozzle, the nitrogen source nozzle, and the board-holding member in the raw material reaction chamber, and a rotation mechanism for rotating the board-holding member in the raw material reaction chamber.

BRIEF DESCRIPTION OF THE DRAWINGS

FIG. 9 is Table 1 showing gas mixing degrees of Comparative Example 1 and Example 1; and FIG. 10 is Table 2 showing a transport efficiency of a $Ga_2O$ gas in a rotation direction of a board susceptor in Example 4.

DETAILED DESCRIPTION

Figure 7:
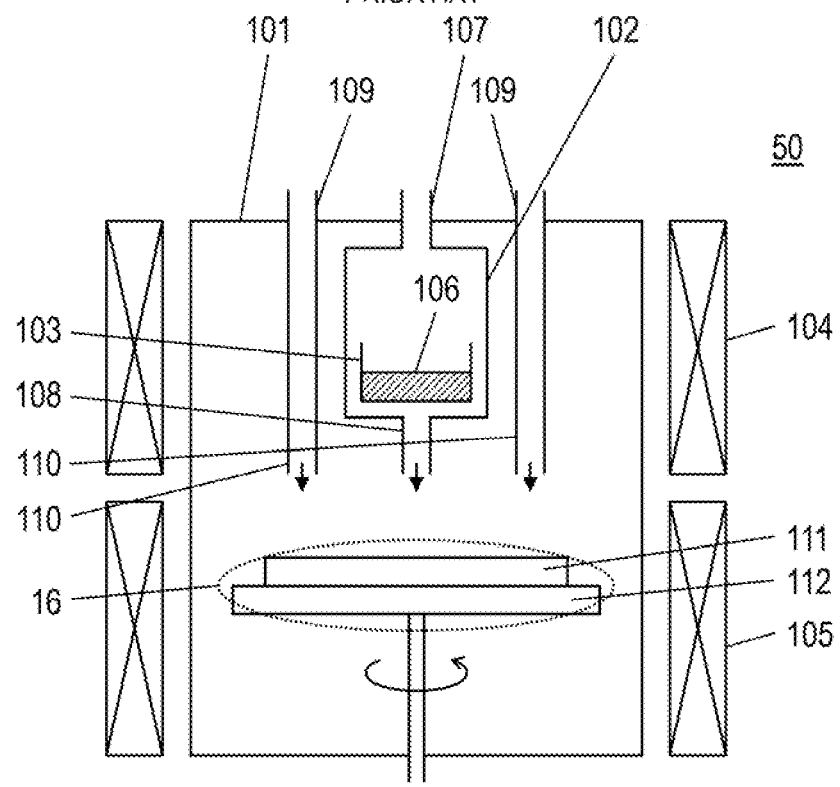
FIG. 7 is a schematic cross-sectional view showing a typical cross-sectional structure of an OVPE apparatus which is one of apparatuses for producing a Group-III nitride semiconductor crystal of the related art.

The temperature of metal raw material 106 in raw material container 103 of the OVPE apparatus of the related art shown in FIG. 7 needs to be maintained at a high temperature of 900° C. or higher in order to generate the Group-III element-containing gas by reacting the metal raw material with a Group-III element metal oxidizing gas. Even in a growth part above the board, the temperature needs to be maintained at a high temperature of approximately 1,400° C. or lower in order to increase the driving force of the Group-III nitride semiconductor crystal generated from the Group-III element-containing gas and the nitrogen element-containing gas. As described above, in the OVPE method or the HVPE method, the inside of the reactor is wholly maintained at a high temperature, which is called Hot Wall heating, and thus, in the configuration described in Published Japanese Translation No. 2008-504443 of the PCT International Publication, the Group-III nitride semiconductor crystal is precipitated in the mixing chamber or the mixing plate. This decreases the raw material components transported to the growth part above the board, and there is a concern that the growth rate may decrease. Furthermore, the Group-III nitride semiconductor crystal precipitated in the mixing chamber or the mixing plate becomes particles and mixes into the growing Group-III nitride semiconductor crystal, and thus there is a problem in that a crystal defect is generated.

An object of the present disclosure is to provide an apparatus for producing a Group-III nitride semiconductor crystal which has been made in order to solve the above-described problem and is capable of suppressing the precipitation of the Group-III nitride semiconductor crystal into a component on a raw material gas introduction path and improving the mixing property of a Group-III element-containing gas and a nitrogen element-containing gas that are supplied to a growth part above a board.

An apparatus for producing a Group-III nitride crystal according to a first aspect includes a raw material reaction chamber, a raw material reactor which is provided in the raw material reaction chamber and generates a Group-III element-containing gas, a board-holding member configured to hold a board in the raw material reaction chamber, a raw material nozzle configured to spray the Group-III element-containing gas toward the board in the raw material reaction chamber, a nitrogen source nozzle configured to spray a nitrogen element-containing gas toward the board in the raw material reaction chamber, in which, in a side view seen in a direction perpendicular to a vertical direction, a spray direction of the nitrogen source nozzle intersects with a spray direction of the raw material nozzle before the board, and a mixing part in which the Group-III element-containing gas and the nitrogen element-containing gas are mixed together is formed around the intersection as a center, a heater for heating the raw material reaction chamber, the raw material nozzle, the nitrogen source nozzle, and the board-holding member in the raw material reaction chamber, and a rotation mechanism for rotating the board-holding member in the raw material reaction chamber.

An apparatus for producing a Group-III nitride crystal according to a second aspect is the first aspect, in which a spray opening of the raw material nozzle may be disposed such that the spray direction of the raw material nozzle is a vertically downward direction, and a spray opening of the nitrogen source nozzle may be disposed such that the spray direction of the nitrogen source nozzle is inclined with respect to the vertical direction and deflected with respect to a horizontal direction.

An apparatus for producing a Group-III nitride crystal according to a third aspect is the first or second aspect, in which the mixing part may be disposed above the board.

An apparatus for producing a Group-III nitride crystal according to a fourth aspect is any of the first to third aspects, in which a deflection direction of the nitrogen source nozzle may be a forward direction of a rotation direction of the board.

Hereinafter, an apparatus and a method for producing a Group-III nitride semiconductor crystal according to an exemplary embodiment will be described with reference to drawings. In the drawings, substantially the same members will be given the same reference symbol.

Exemplary Embodiment 1

Apparatus for Producing Group-III Nitride Semiconductor Crystal

Hereinafter, Exemplary Embodiment 1 will be described with reference to FIG. 1.

Figure 1:
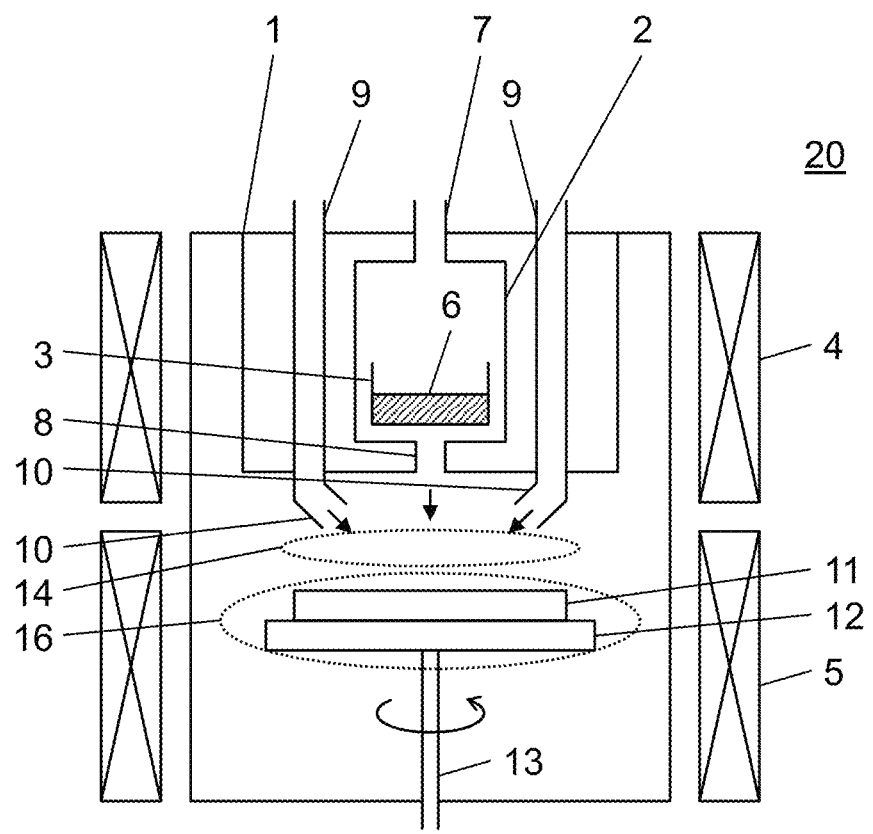
FIG. 1 is a schematic cross-sectional view showing an example of a cross-sectional configuration of an apparatus for producing a Group-III nitride semiconductor crystal according to Example 1.

FIG. 1 is a schematic cross-sectional view showing an example of a cross-sectional configuration of an apparatus for producing a Group-III nitride semiconductor crystal according to Exemplary Embodiment 1. In FIG. 1, there is a case where the sizes, ratios, and the like of individual configurational members are different from actual ones.

The apparatus for producing a Group-III nitride crystal according to Exemplary Embodiment 1 is a vapor-phase growth apparatus and includes reaction container 1 configured to carry out crystal growth of a nitride semiconductor, raw material container 3 configured to generate a Group-III element-containing gas, raw material nozzle 8 configured to spray a Group-III element-containing gas toward seed board 11, and nitrogen source nozzles 10 configured to spray a nitrogen element-containing gas toward seed board 11. In a side view seen in a direction perpendicular to the vertical direction, a spray direction of nitrogen source nozzle 10 intersects with a spray direction of raw material nozzle 8 before seed board 11, and a mixing part in which a Group-III element-containing gas and a nitrogen element-containing gas are mixed together is formed around the intersection as a center. Raw material container 3 and raw material nozzle 8 are connected to each other. A Group-III element-containing gas supplied from raw material nozzle 8 and a nitrogen element-containing gas supplied from nitrogen source nozzles 10 are mixed together in the mixing part, and then a Group-III nitride semiconductor crystal grows on seed board 11 mounted on board susceptor 12 in a growth part on seed board 11. Board susceptor 12 and rotary shaft 13 are connected to each other, and rotary shaft 13 rotates board susceptor 12.

According to apparatus for producing Group-III nitride semiconductor crystal 20 according to Exemplary Embodiment 1, it is possible to suppress the precipitation of a Group-III nitride semiconductor crystal into a component on a raw material gas introduction path and improve the mixing property of the Group-III element-containing gas and the nitrogen element-containing gas supplied to growth part 16 above board 11. Furthermore, it is possible to increase a raw material gas transport efficiency to board 11.

Hereinafter, configurational members of apparatus for producing Group-III nitride semiconductor crystal 20 will be described.

Raw Material Reaction Chamber

In raw material reaction chamber 2 including reactive gas supply pipe 7, raw material container 3 on which starting Ga source 6, which is a Group-III element-containing source, is placed is disposed. As a Group-III element, in addition to Ga, Al, In, $Ga_2O_3$ as an oxide, or the like is used. First heater 4 is provided in an outer circumferential part of raw material reaction chamber 2, and the inside of raw material reaction chamber 2 is maintained at a desired temperature. In order to generate the Group-III element-containing gas, the inside is preferably maintained at 900° C. or higher and 1,300° C. or lower. When a reactive gas is supplied to heated starting Ga source 6, starting Ga source 6 and the reactive gas react with each other to generate the Group-III element-containing gas.

As a method for generating the Group-III element-containing gas, there are a method in which starting Ga source 6 is oxidized and a method in which starting Ga source 6 is reduced.

As the method in which starting Ga source 6 is oxidized, a reaction system in a case where metallic Ga is used as starting Ga source 6 and $H_2O$ gas is used as an oxidizing gas will be described. The metallic Ga, which is starting Ga source 6, is heated, and, in this state, the $H_2O$ gas, which is an oxidizing gas, is introduced thereto. As shown in Expression (1), the introduced $H_2O$ gas reacts with the metallic Ga to generate $Ga_2O$ gas that is a Group-III element-containing gas.

$$2Ga + H_2O \rightarrow Ga_2O + H_2 \qquad (1)$$

In addition, in addition to starting Ga source 6, an In source or an Al source can be employed as a Group-III element-containing source. In any case, a Group-III oxide gas is generated.

Next, as the method in which starting Ga source 6 is reduced, a reaction system in a case where $Ga_2O_3$ is used as starting Ga source 6 and $H_2$ gas is used as a reducing gas will be described. $Ga_2O_3$, which is starting Ga source 6 is heated, and, in this state, $H_2$ gas, which is a reducing gas, is introduced thereto. As shown in Expression (2), the introduced $H_2$ gas reacts with $Ga_2O_3$ to generate $Ga_2O$ gas that is a Group-III element-containing gas.

$$Ga_2O_3 + 2H_2 \rightarrow Ga_2O + 2H_2O \qquad (2)$$

As a transport gas of the oxidizing gas and the reducing gas, an inert gas such as Ar or $N_2$ or $H_2$ gas is used.

Raw Material Nozzle

The Group-III element-containing gas generated in raw material reaction chamber 2, for example, $Ga_2O$ gas, is sprayed vertically downward from raw material nozzle 8 provided downstream of raw material reaction chamber 2 toward seed board 11. In addition, in order to suppress the precipitation of the Group-III nitride semiconductor crystal into raw material nozzle 8 and nitrogen source nozzle 10, a separate gas discharge opening is more preferably formed in an outer circumference of raw material nozzle 8. An inner diameter of raw material nozzle 8 is not particularly limited, but is preferably in a range of 1 mm or more and 100 mm or less and more preferably 20 mm or more and 60 mm or less.

Nitrogen Source Nozzle

Nitrogen source nozzle 10 includes nitrogen element-containing gas supply pipe 9. The nitrogen element-containing gas is sprayed from nitrogen source nozzle 10 toward seed board 11. In a side view seen in the direction perpendicular to the vertical direction, the spray direction of nitrogen source nozzle 10 intersects with the spray direction of raw material nozzle 8 before seed board 11. Mixing part 14 in which the Group-III element-containing gas and the nitrogen element-containing gas are mixed together is formed around intersection point 15 as a center. This mixing part 14 specifically means a region broadening in a horizontal plane between raw material nozzle 8 and nitrogen source nozzle 10 and seed board 11.

Figure 2A:
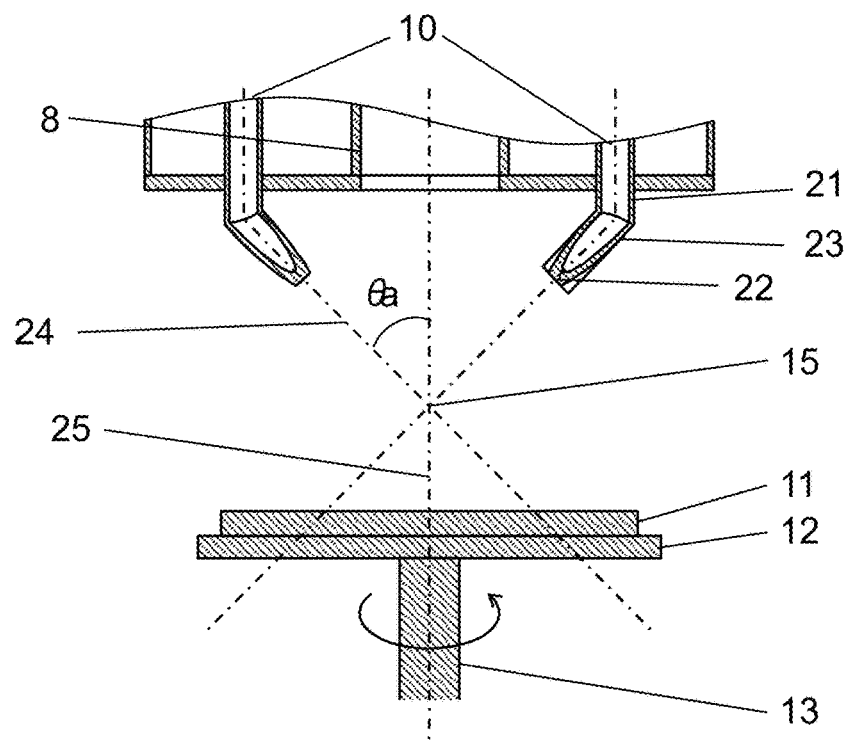
FIG. 2A is a planar cross-sectional view seen from a gas supply side which shows a structure of a raw material nozzle and a nitrogen source nozzle for which the apparatus for producing a Group-III nitride semiconductor crystal of FIG. 1 is used.

As shown in FIG. 2A, nitrogen source nozzle 10 includes main body part 21 and tip part 23 having spray opening 22. Tip part 23 is inclined at an inclination angle θa with respect to the vertical direction. That is, in a side view, imaginary line 24 extending from tip part 23 and imaginary line 25 extending from raw material nozzle 8 intersect with each other at intersection point 15 positioned above board susceptor 12. The inclination angle θa is an angle formed by imaginary line 24 and imaginary line 25.

Figure 2B:
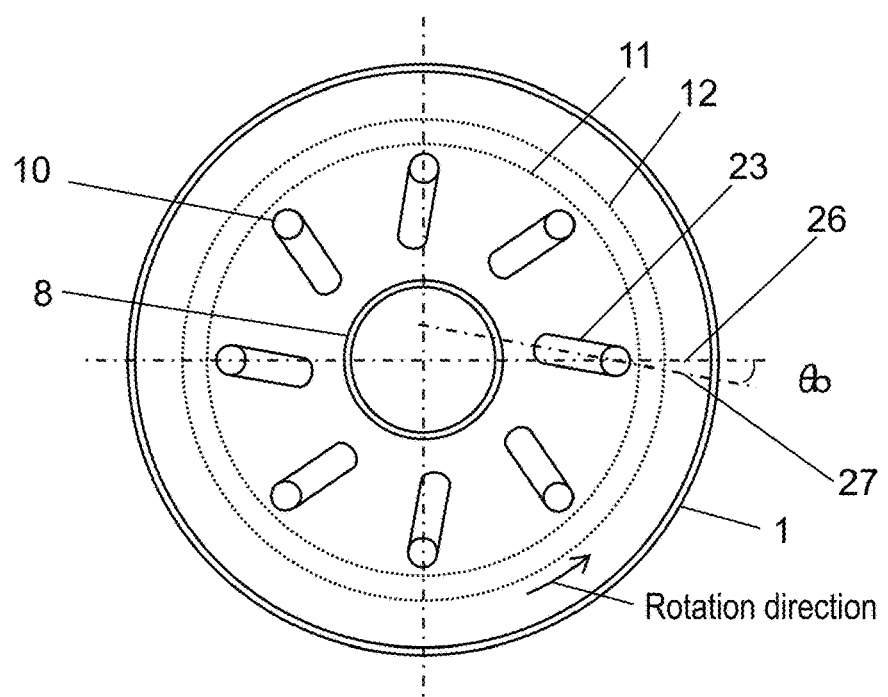
FIG. 2B is a horizontal cross-sectional view seen from vertically above which shows the structure of the raw material nozzle and the nitrogen source nozzle for which the apparatus for producing a Group-III nitride semiconductor crystal of FIG. 1 is used.

In addition, as shown in FIG. 2B, apparatus for producing Group-III nitride semiconductor crystal 20 includes a plurality of nitrogen source nozzles 10. The plurality of nitrogen source nozzles 10 is radially disposed around the center of board susceptor 12. In a plan view, tip part 23 is inclined at a deflection angle θb with respect to the horizontal direction. Here, a line linking a contact point between main body part 21 and tip part 23 and the center of board susceptor 12 is regarded as imaginary line 26. That is, the deflection angle θb is an angle formed by imaginary line 26 and imaginary line 27 extending from tip part 23 in a plan view.

As the nitrogen element-containing gas, $NH_3$ gas, NO gas, $NO_2$ gas, $N_2H_2$ gas, $N_2H_4$ gas, or the like can be used. The nitrogen element-containing gas is sprayed in an inclined fashion with respect to the vertical direction in a side view as shown in FIG. 2A and sprayed from nitrogen source nozzle 10 deflected with respect to the horizontal direction in a plan view as shown in FIG. 2B. An inner diameter of nitrogen source nozzle 10 is not particularly limited, but is preferably more than 0 mm and 30 mm or less and more preferably 3 mm or more and 15 mm or less. The inclination angle θa of nitrogen source nozzle 10 is not particularly limited, but is preferably more than zero degrees and less than 90 degrees and more preferably in a range of 5 degrees to 60 degrees. The deflection angle θb of nitrogen source nozzle 10 is not particularly limited, but is preferably more than zero degrees and less than 90 degrees and more preferably in a range of 5 degrees to 45 degrees. First heater 4 is provided in an outer circumferential part of nitrogen source nozzle 10 and is heated to the same temperature as the temperature of raw material reaction chamber 2 described above. Due to this heat, $NH_3$ in nitrogen source nozzle 10 gets into a state of being decomposed at a predetermined ratio.

As shown in FIG. 2B, nitrogen source nozzles 10 have spray directions deflected in a forward direction of a rotation direction of board susceptor 12 in a plan view and thus form a swirl flow and become capable of enhancing a mixing property of the Group-III element-containing gas and the nitrogen element-containing gas. The deflection direction of nitrogen source nozzle 10 is not limited to the above-described case of the forward direction, and the spray direction may be deflected in a reverse direction of the rotation direction of board susceptor 12 in the plan view.

Mixing Part

In mixing part 14, the Group-III element-containing gas supplied from raw material nozzle 8 and the nitrogen element-containing gas supplied from nitrogen source nozzles 10 are mixed together. In addition, second heater 5 is provided in an outer circumferential part in order to maintain the gases at a desired temperature.

Mixing part 14 is not particularly limited, but is preferably present above the board surface toward nitrogen source nozzles 10.

Growth Part

Growth part 16 includes seed board 11, board susceptor 12, and rotary shaft 13. Second heater 5 is provided in an outer circumferential part of growth part 16, and the growth part is maintained at a desired temperature. The temperature of second heater 5 is preferably maintained at 1,000° C. or higher and 1,400° C. or lower in order to grow the Group-III nitride semiconductor crystal. The Group-III element-containing gas and the nitrogen element-containing gas mixed in mixing part 14 react with each other above seed board 11 in heated growth part 16, whereby a Group-III nitride semiconductor crystal grows.

Board susceptor 12 has a shape for holding seed board 11 and, while there is no particular limitation as long as a main surface of seed board 11 is disposed opposite to raw material nozzle 8, preferably does not have a structure in which crystal growth is hindered. When there is a structure having a possibility of growing near a crystal growth surface, a polycrystalline body adheres thereto and deteriorates the uniformity of grown films. As a material, for example, carbon, SiC-coated carbon, PG-coated carbon, PBN-coated carbon, or silicon nitride can be used.

The rotation direction of rotary shaft 13 is set to the same direction as the above-described deflection direction of nitrogen source nozzle 10, and the rotary shaft is preferably a mechanism capable of controlling rotation of approximately 3,000 rpm or less.

Unreacted Group-III oxide gas, nitrogen element-containing gas, and transport gas are discharged from a discharge opening (not shown).

Due to what has been described above, it is possible to suppress the precipitation of the Group-III nitride semiconductor crystal into raw material nozzle 8 and nitrogen source nozzle 10 and improve the mixing property of the Group-III element-containing gas and the nitrogen element-containing gas supplied to growth part 16. Therefore, it is possible to uniform a gas concentration distribution above seed board 11 and, furthermore, increase the raw material gas transport efficiency to seed board 11.

Example 1

Figure 4:
FIG. 4 is a view showing a rate vector distribution of a Group-III element-containing gas and a nitrogen element-containing gas in a mixing part according to Example 1.

FIG. 4 is a view showing a rate vector distribution of a Group-III element-containing gas and a nitrogen element-containing gas in a mixing part according to Example 1. In Example 1, the respective conditions of the method for producing a Group-III nitride semiconductor crystal according to Exemplary Embodiment 1 were specifically set as described below and, as shown in FIG. 4, a thermo-fluid analysis was carried out by computer aided engineering (CAE).

An inner diameter of raw material nozzle 8 was set to 50 mm, and a distance between the tip of raw material nozzle 8 and a seed board surface was set to 100 mm. An inner diameter of nitrogen source nozzle 10 was set to 5 mm, and, regarding a spray direction, the inclination angle θa was set to 45 degrees downward with respect to a vertical direction, and the deflection angle θb was set to 10 degrees counterclockwise with respect to a radial direction toward a center in a plan view. A distance between a converging point of the nitrogen element-containing gas sprayed from nitrogen source nozzles 10 and the surface of seed board 11 was set to 35 mm. As seed board 11, a GaN single-crystal board having a diameter of 100 mm was used.

Metallic Ga was set as starting Ga source 6 in raw material container 3, as a reactive gas, $H_2O$ gas generated from 4 SLM of $H_2$ gas and 20 SCCM of $O_2$ gas was introduced from reactive gas supply pipe 7, and $Ga_2O$ gas was generated. In addition, 1 SLM of $N_2$ gas was introduced as a transport gas. From nitrogen source gas supply pipe 9, 1 SLM of $NH_3$ gas was introduced as a nitrogen element-containing gas, and 4 SLM of $H_2$ gas and 4 SLM of $N_2$ gas were introduced as transport gases. Electric power was supplied such that first heater 4 disposed in an outer circumferential part of reaction container 1 reached 1,150° C. and second heater 5 disposed in an outer circumferential part of a growth part reached 1,200° C. Board susceptor 12 was rotated at 1,000 RPM, and a thermo-fluid analysis was carried out.

Comparative Example 1

Figure 3:
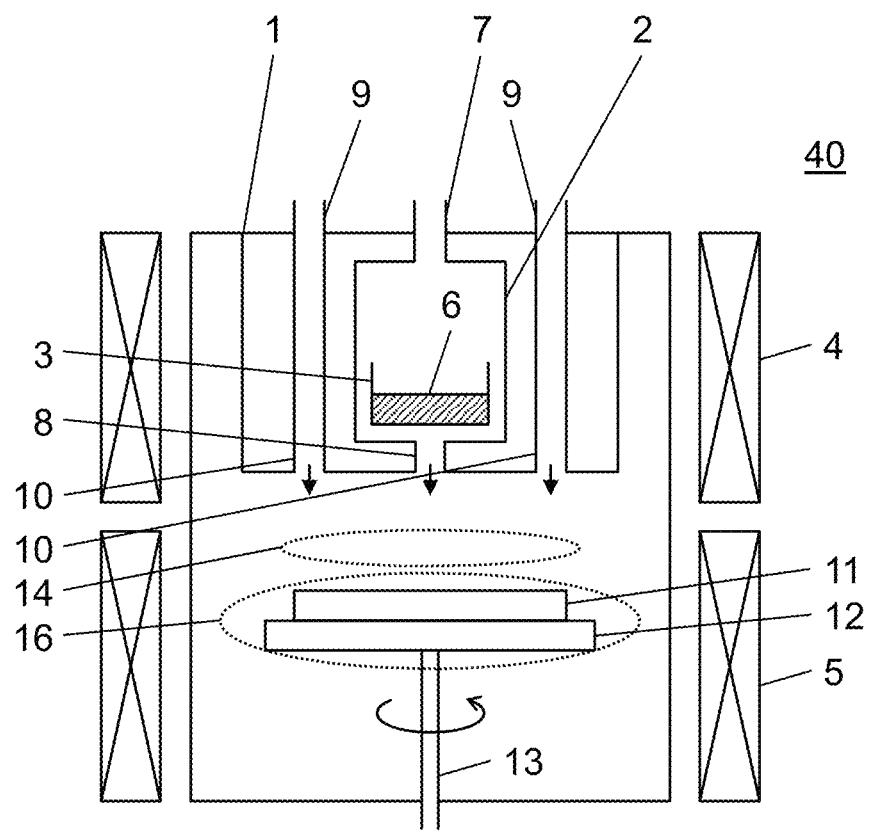
FIG. 3 is a schematic cross-sectional view showing an example of a cross-sectional configuration of an apparatus for producing a Group-III nitride semiconductor crystal according to Comparative Example 1.
Figure 5:
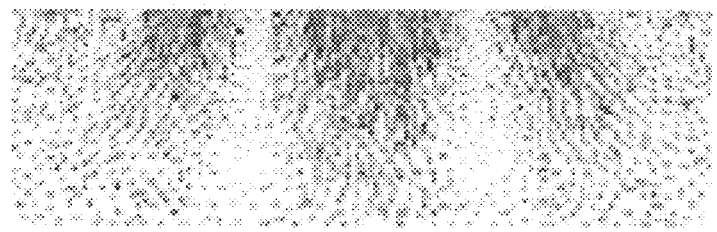
FIG. 5 is a view showing a rate vector distribution of a Group-III element-containing gas and a nitrogen element-containing gas in a mixing part according to Comparative Example 1.

FIG. 3 is a schematic cross-sectional view showing an example of a cross-sectional configuration of apparatus for producing Group-III nitride semiconductor crystal 40 according to Comparative Example 1. In comparison with Example 1, in Comparative Example 1, nitrogen source nozzles 10 having an inclined and deflected spray direction were removed. That is, in Comparative Example 1, as shown in FIG. 5, a thermo-fluid analysis was carried out by CAE under the same conditions as in Example 1 except for the fact that the Group-III element-containing gas sprayed from raw material nozzle 8 and the nitrogen element-containing gas sprayed from nitrogen source nozzles 10 were not positively mixed together.

In Example 1 and Comparative Example 1, the thermo-fluid analysis was carried out, and a mixing state of the Group-III element-containing gas and the nitrogen element-containing gas in the mixing part by a rate vector was evaluated. FIG. 4 and FIG. 5 show rate vector distributions of the Group-III element-containing gas and the nitrogen element-containing gas in mixing part 14. FIG. 4 and FIG. 5 are views obtained by converting views originally displayed in color to grayscale, and thus, strictly speaking, the contrasting densities do not exactly correspond to the degrees of the rate, but means that, as the color of a region becomes darker, the rate becomes faster. In Example 1, as shown in FIG. 4, a dark region spreads from the end part toward the center, and it could be confirmed that the Group-III element-containing gas and the nitrogen element-containing gas were well mixed together; however, in Comparative Example 1, as shown in FIG. 5, it was found that three dark regions were separately present, and it could be confirmed that the Group-III element-containing gas and the nitrogen element-containing gas mutually formed laminar flows and were not well mixed.

Next, in Example 1 and Comparative Example 1, the mixing state of the Group-III element-containing gas and the nitrogen element-containing gas immediately above the board was quantitatively evaluated. A value obtained by dividing a molar fraction of the nitrogen element-containing gas immediately above the board by a molar fraction of the Group-III element-containing gas is defined as a V/III ratio. A gas mixing degree of the nitrogen element-containing gas and the Group-III element-containing gas was calculated from the following expression. Regarding the gas mixing degree of the nitrogen element-containing gas and the Group-III element-containing gas, as the numerical value becomes smaller, the mixing property becomes more favorable.

Gas mixing degree=(V/III ratio at board end part−V/III ratio at board center)/(average value of V/III ratios)

FIG. 9 is Table 1 showing gas mixing degrees of Comparative Example 1 and Example 1. As shown in Table 1, while the gas mixing degree of Comparative Example 1 was 2.34, the gas mixing degree of Example 1 became 0.29, and it could be confirmed that the mixing property was improved approximately eight times by inclining and deflecting nitrogen source nozzles 10.

Example 2

Figure 8:
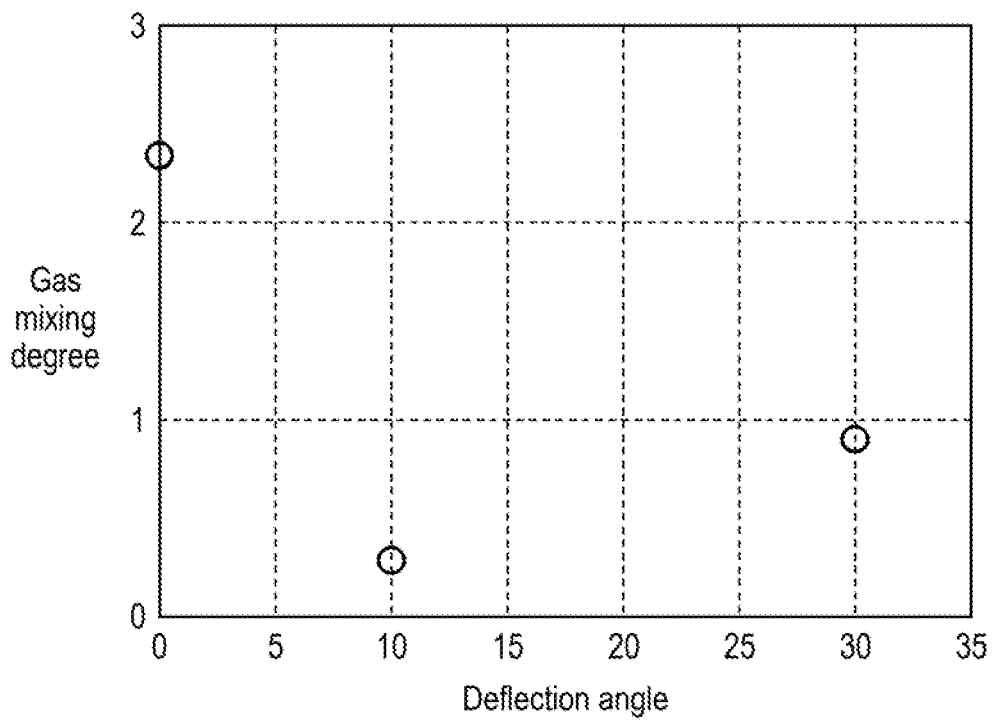
FIG. 8 is a view showing a relationship between a deflection angle of a nitrogen source nozzle and a gas mixing degree in Example 2.

FIG. 8 is a view showing a relationship between the deflection angle θb of a nitrogen source nozzle and a gas mixing degree in Example 2.

The deflection angle θb of the nitrogen source nozzle was set to zero degrees and 30 degrees. Regarding the other configurations, a thermo-fluid analysis was carried out under the same conditions as in Example 1, and the relationship between the deflection angle θb of the nitrogen source nozzle and the gas mixing degree was verified. As shown in FIG. 8, it could be confirmed that the mixing property was most favorable when the deflection angle θb was 10 degrees.

Example 3

A rotation speed of board susceptor 12 was set to 0 RPM (no rotation) and 3,000 RPM. The other configurations were set to the same conditions as in Example 1, a thermo-fluid analysis was carried out, and a transport efficiency of the raw material gas was verified. The transport efficiency of the raw material gas was calculated by dividing a mass weight of $Ga_2O$ gas, which was the Group-III element-containing gas, and $NH_3$ gas, which was the nitrogen element-containing gas, passing through a space 1 mm high from the board by a mass flow rate of the gases emitted from raw material nozzle 8 and nitrogen source nozzles 10. That is, it means that, as the source gas transport efficiency increases, a larger amount of the $Ga_2O$ gas and the $NH_3$ gas reach above seed board 11 and contribute to the reaction, and thus a growth rate increases.

Figure 6:
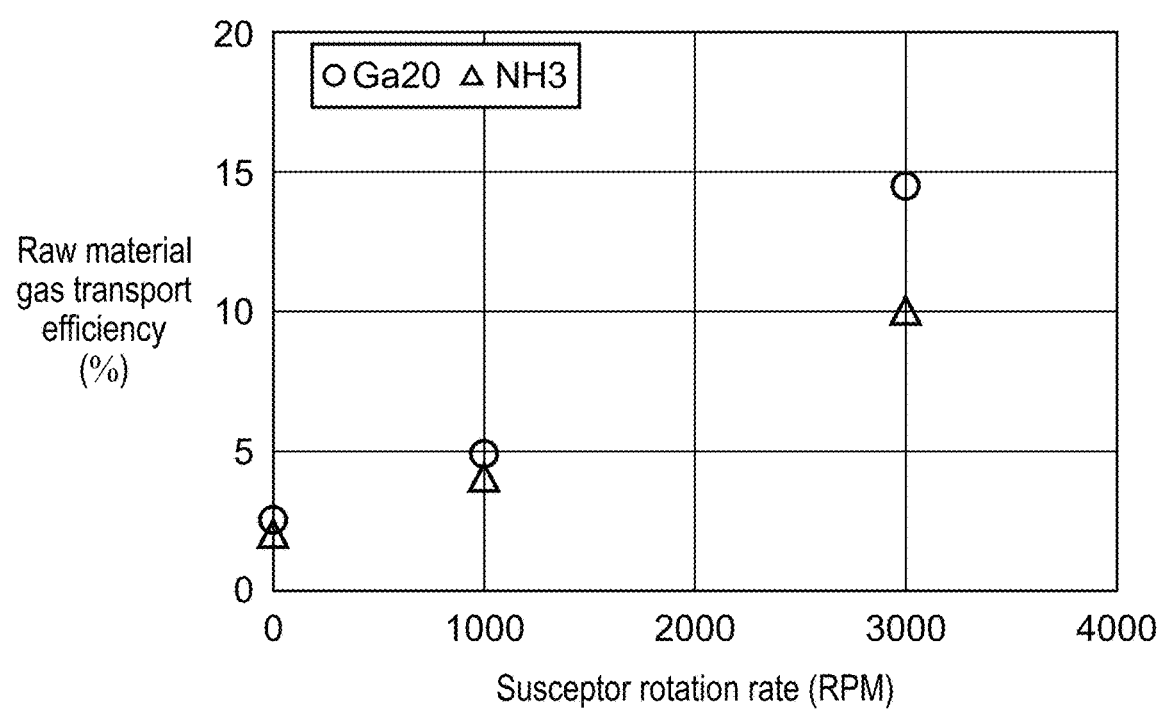
FIG. 6 is a graph showing relationships between a board susceptor rotation rate and a raw material gas transport efficiency respectively for Group-III element-containing gases and nitrogen element-containing gases according to Examples 1 and 3.

FIG. 6 is a graph showing relationships of the raw material gas transport efficiency with respect to the rotation rate of the board susceptor in Example 1 and Example 3. It could be confirmed that, as the rotation speed of the board susceptor increases, the raw material transport efficiency increases for both of the $Ga_2O$ gas and the $NH_3$ gas.

Example 4

A rotation speed of board susceptor 12 was set to −2,300 RPM and 2,300 RPM. A reference symbol of the rotation speed was set to be positive in a case where the deflection direction of the nozzle and the rotation direction of the board were the forward direction and set to be negative in a case where the directions were the reverse direction. The other configurations were set to the same conditions as in Example 1, a thermo-fluid analysis was carried out, and a transport efficiency of $Ga_2O$ gas was verified.

FIG. 10 is Table 2 showing the transport efficiency of the $Ga_2O$ gas in the rotation direction of the board susceptor in Example 4. As shown in Table 2, in a case where the rotation speed of the board susceptor was −2,300 rpm, that is, the deflection direction of the nozzle and the rotation direction of the board were the reverse direction, the transport efficiency of the $Ga_2O$ gas was 6.3%. In addition, in a case where the rotation speed of the board susceptor was 2,300 rpm, that is, the deflection direction of the nozzle and the rotation direction of the board were the forward direction, the transport efficiency of the $Ga_2O$ gas was 8.6%. It could be confirmed that, in comparison with a case where the deflection direction of the nozzle and the rotation direction of the board were the forward direction, when the deflection direction of the nozzle and the rotation direction of the board were set to the reverse direction, the transport efficiency of the Ga2O gas decreased by approximately 27%.

The present disclosure is not limited to the above-described exemplary embodiment and can be modified in a variety of manners within the scope of claims, and an exemplary embodiment obtained by appropriately combining technical means respectively disclosed in different exemplary embodiments is also included in the technical scope of the present disclosure.

According to the apparatus for producing a Group-III nitride semiconductor crystal of the present disclosure, it is possible to suppress the precipitation of the Group-III nitride semiconductor crystal into a component on a raw material gas introduction path and uniform the gas concentration distribution above the board by improving the mixing property of the Group-III element-containing gas and the nitrogen element-containing gas supplied to the growth part above the board.

According to the apparatus for producing a Group-III nitride semiconductor crystal according to the present disclosure, it is possible to suppress the precipitation of the Group-III nitride semiconductor crystal into a component on a raw material gas introduction path and improve the mixing property of the Group-III element-containing gas and the nitrogen element-containing gas supplied to the growth part above the board. Therefore, it is possible to uniform the gas concentration distribution above the board and, furthermore, increase the raw material gas transport efficiency to the board. The Group-III nitride semiconductor crystal obtained by the apparatus for producing a Group-III nitride semiconductor crystal according to the present disclosure can be used in, for example, an optical device such as a light emitting diode or a laser diode, an electronic device such as a rectifier or a bipolar transistor, a semiconductor sensor such as a temperature sensor, a pressure sensor, a radiation sensor, or a visible-ultraviolet light detector, and the like. However, the present disclosure is not limited to the above-mentioned applications and can be applied to a wide range of fields.

What is claimed is:

1. An apparatus for producing a Group-III nitride semiconductor crystal, the apparatus comprising:
   a raw material reaction chamber;
   a raw material reactor which is provided in the raw material reaction chamber and configured to generate a Group-III element-containing gas;
   a board-holding member configured to hold a board in the raw material reaction chamber;
   a raw material nozzle configured to spray the Group-III element-containing gas toward the board in the raw material reaction chamber;
   a first nitrogen source nozzle configured to spray a nitrogen element-containing gas toward the board in the raw material reaction chamber;
   a second nitrogen source nozzle configured to spray the nitrogen element-containing gas toward the board in the raw material reaction chamber;
   a heater for heating the raw material reaction chamber, the raw material nozzle, the first nitrogen source nozzle, the second nitrogen source nozzle, and the board-holding member in the raw material reaction chamber; and
   a rotation mechanism for rotating the board-holding member in the raw material reaction chamber,
   wherein:
   (i) the first nitrogen source nozzle is configured to spray the nitrogen element-containing gas in a first spray direction which is inclined with respect to a vertical direction and deflected with respect to a horizontal direction and intersects with a vertically downward spray direction of the raw material nozzle at a first intersection underneath the raw material nozzle, and
   (ii) the second nitrogen source nozzle is configured to spray the nitrogen element-containing gas in a second spray direction which is inclined with respect to the vertical direction and deflected with respect to the horizontal direction and intersects with the vertically downward spray direction of the raw material nozzle at a second intersection underneath the raw material nozzle such that a mixing part in which the Group-III element-containing gas and the nitrogen element-containing gas are mixed together is formed around the first intersection and the second intersection; and
   in a side view seen in a direction perpendicular to the vertical direction, an inclination of the first nitrogen source nozzle is opposite to an inclination of the second nitrogen source nozzle.

2. The apparatus of claim 1,
   wherein a deflection direction of the first nitrogen source nozzle or the second nitrogen nozzle is a forward direction of a rotation direction of the board.

* * * * *